(12) United States Patent
Fu et al.

(10) Patent No.: US 7,057,418 B1
(45) Date of Patent: Jun. 6, 2006

(54) HIGH SPEED LINEAR HALF-RATE PHASE DETECTOR

(75) Inventors: Wei Fu, San Diego, CA (US); Sudhaker Reddy Anumula, San Diego, CA (US); Hongwen Lu, San Diego, CA (US); Joseph J. Balardeta, Encinitas, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 6 days.

(21) Appl. No.: 10/823,060

(22) Filed: Apr. 13, 2004

(51) Int. Cl.
*G01R 25/00* (2006.01)

(52) U.S. Cl. .......................... 327/3; 331/25

(58) Field of Classification Search ................ 327/2–5, 327/7–10, 12, 147–150, 156–163; 331/1 A, 331/25, 172; 375/375, 376, 327
See application file for complete search history.

(56) References Cited

U.S. PATENT DOCUMENTS

| 5,799,048 | A | * | 8/1998 | Farjad-Rad et al. | ........ 375/360 |
| 6,055,286 | A | * | 4/2000 | Wu et al. | .................... 375/375 |
| 6,081,572 | A | * | 6/2000 | Filip | .......................... 375/376 |
| 6,240,523 | B1 | * | 5/2001 | Rogers | ....................... 713/400 |
| 6,614,314 | B1 | * | 9/2003 | d'Haene et al. | ............ 331/1 A |
| 2004/0114702 | A1 | * | 6/2004 | Friedman et al. | ........... 375/373 |

* cited by examiner

*Primary Examiner*—Minh Nguyen
(74) *Attorney, Agent, or Firm*—INCAPLAW; Terrance A. Meador (57) ABSTRACT

A high-speed, half rate phase detector provides an effective solution to the problem of XOR gate response to the minimum width signal precursors (Q1 and Q2) of a phase signal that indicates a phase difference between a data signal and a clock signal by combining the precursor signals in a multiplexer and combining the multiplexed signal with the data signal in an XOR gate. This affords the transition information in the transitions of the precursor signals, which is significant of phase difference, without requiring the XOR gate to respond to the minimum widths of those pulses.

13 Claims, 5 Drawing Sheets

FIG. 1

FIG. 2 PRIOR ART PHASE DETECTOR

FIG. 3 PRIOR ART WAVEFORMS

HIGH SPEED LINEAR HALF-RATE PHASE DETECTOR

BACKGROUND

The invention concerns the operation and architecture of a linear half-rate phase detector, and more particularly concerns a half-rate phase detector for a phase-locked loop which produces a linear phase difference output signal by combining signals indicative of the phase relationship between a recovered clock signal and a received non-return to zero (NRZ) data signal, with a delayed version of the NRZ data signal.

Phase synchronization and clock recovery, an important component of digital communications, is a manifold process by which a receiver is synchronized to an incoming signal in order that the receiver be enabled to reliably extract clock information from the input signal. One communication component used for such synchronization is the phase-locked loop (PLL). In NRZ signaling schemes, a PLL is a servo loop which compares a version of a clock signal embedded in the NRZ signal with a version of the clock signal synthesized from the incoming signal by the PLL. The PLL operates to measure and correct phase difference between the two clock signals. A typical PLL architecture with a frequency aided acquisition loop is illustrated in FIG. 1.

Figure 1:
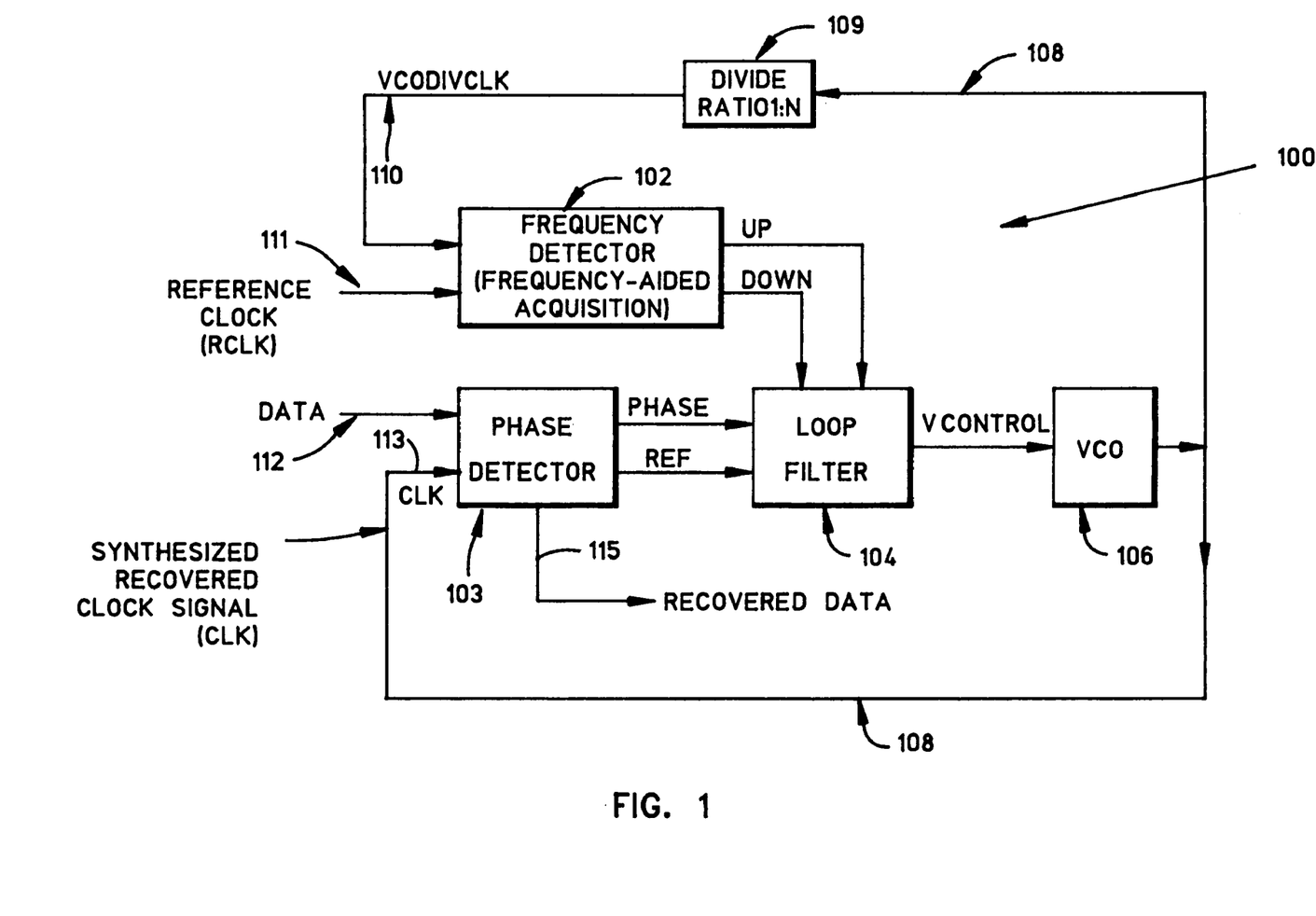
FIG. 1 is a block diagram illustrating the architecture of a phase-locked loop.

In FIG. 1, a PLL 100 includes a frequency detector 102 and phase detector 103 as would be found, for example, in a digital receiver. The PLL 100 further includes a loop filter 104, voltage controlled oscillator (VCO) 106 and frequency divider 109 with division value N. The PLL has an input 110 to receive a divided-down clock signal (VCODIVCLK) and an input 111 to receive a reference clock (RCLK), which aid in a frequency acquisition process. For phase acquisition, the PLL has two inputs, 112 and 113, for respectively receiving an incoming data signal (DATA) and a synthesized clock signal (CLK) recovered by the PLL 100 from the incoming data signal. The frequency acquisition process is conducted as follows. The frequency detector 102 receives RCLK and VCODIVCLK (the clock output of the VCO 106, divided by N) as inputs. The frequency detector 102 has UP and DOWN outputs. If the frequency of VCODIVCLK is higher than the frequency of RCLK, the average of the UP-DOWN outputs is negative. If the frequency of VCODIVCLK is lower than the frequency of RCLK, the average of the UP-DOWN outputs is positive. The UP-DOWN outputs are averaged by the loop filter 104. In response to the UP-DOWN outputs, the loop filter 104 generates a voltage signal $V_{control}$ that controls the response of the PLL 100 to indicated errors in frequency difference measured by the frequency detector 102. The VCO 106 produces the CLK signal at a frequency determined by the voltage level of the $V_{control}$ signal. The condition where the average of the UP-DOWN outputs is zero is referred to as "frequency lock". At frequency lock the frequency of the CLK signal is exactly "N" times the frequency of RCLK. When frequency lock occurs, control of the frequency/phase lock process is passed to the phase detector 103, which operates to acquire phase lock between the DATA and CLK signals, and to extract clock signal information from the DATA signal. In operation, the phase detector 103 produces a phase synchronization signal (PHASE) and a data reference signal (REF). The PHASE signal indicates the degree and direction of any phase difference between the DATA and CLK signals. The REF signal indicates the degree of synchronization between a data pattern, or symbol interval in the DATA signal and a corresponding integration interval in the PLL. The REF signal provides a reference comparison for the PHASE signal for different data patterns in the DATA signal. In a phase acquisition lock condition, the phase detector 103 produces a net average zero signal, wherein PHASE−REF=0. The loop filter 104 receives the PHASE and REF signals and generates the voltage signal $V_{control}$ in response thereto. The $V_{control}$ signal controls the response of the PLL 100 by indicating errors in phase between the DATA and CLK signals as measured by the phase detector 103. The VCO 106 produces a synthesized recovered clock signal (CLK) on an output 108 that is aligned with the phase of the DATA signal ("phase aligned") at a frequency determined by the voltage level of the $V_{control}$ signal. The CLK signal is provided to the input of the frequency divider 109, which divides it by N to produce VCODICCLK. The output is also connected to the input 113 of the phase detector 103 in order to provide the CLK signal as an input to the phase detector 103. The phase detector 103 also responds to the DATA and CLK signals by extracting data from the DATA signals and providing the extracted data as a RECOVERED DATA signal on output.

Figure 2:
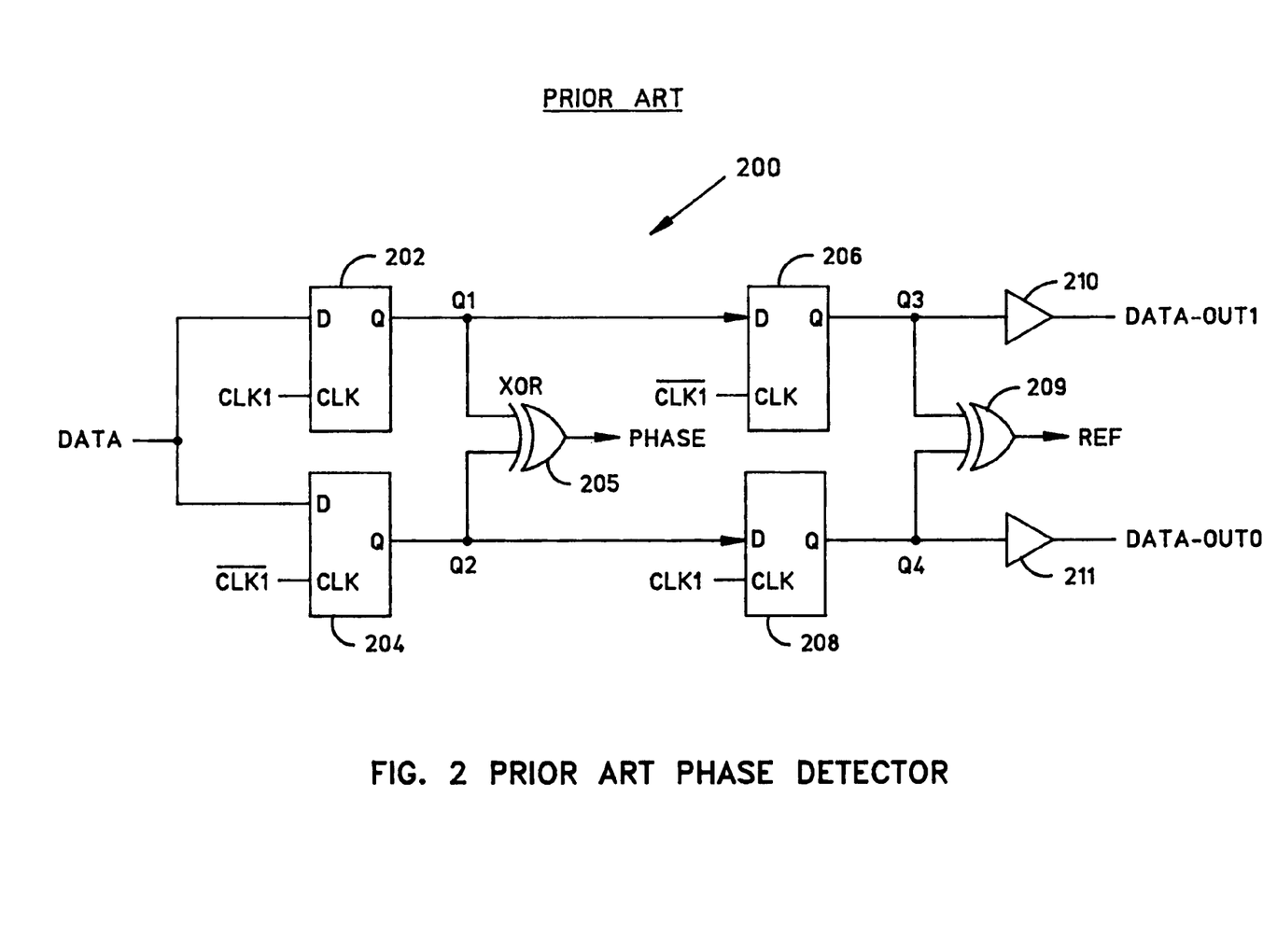
FIG. 2 is a logic diagram illustrating the architecture of a prior art half-rate phase detector.

The phase detector 103 of the PLL 100 may be practiced as a prior art phase detector 200, illustrated in FIG. 2. Although illustrated as a discrete, or stand-alone apparatus comprising a combination of elements, the prior art phase detector 200 (and the novel phase detector later described) would preferably be found as a component of an integrated circuit (IC), often, although not necessarily, in combination with a frequency detector, manufactured using semiconductor technology, and intended for use in an integrated electronics appliance such as a receiver.

The phase detector 200 is a high-speed linear half rate phase detector. In this regard, it is high-speed in that it must be able to respond to pulse signals having pulse widths that may be as narrow as a few tens of picoseconds. The phase detector is said to be "half rate" in that the CLK signal is equal in frequency to the fundamental rate of the DATA signal. In this regard, there are "full rate" phase detectors that operate at twice the rate of an incoming data signal. These full rate phase detectors are manufactured using exotic semiconductor process technologies that produce very high speed devices capable of responding to pulse signals having pulse widths that are less than ten picoseconds wide; however, such devices use non-standard process technologies and are very expensive to integrate with standard process technologies. Half rate phase detectors, on the other hand, are manufactured using standard process technology. A linear half rate phase detector may have an architecture that is easy to integrate with larger chips while still delivering optimum speed and power performance comparable to full rate phase detectors.

Referring to FIG. 2, the phase detector 200 detects a phase difference between the DATA signal and the CLK signal recovered from the DATA signal. The phase detector 200 includes a first latch 202 and a second latch 204. A latch is a data storage device that samples an input signal in response to a clock signal. In this regard, each of the latches 202 and 204 has an input (D) for a data signal, a input (CLK) for a clock signal. The output (Q) of each latch is enabled by a first transition of a CLK input such that the signal on the output follows ("samples") the signal at the latch's input until the CLK input transitions at the transition (the second transition) immediately following the first transition. Following the second transition, the output stays at the level the input signal had at the second transition. The output of the first latch 202 is connected to a first input of a first exclusive- OR (XOR) gate 205, and to the input (D) of a third latch 206. The output of the second latch 204 is connected to a second input of the XOR gate 205, and to the input (D) of a fourth latch 208. The first XOR gate 205 produces the PHASE signal at its output. The output (Q) of the third latch 206 is connected to a first input of a second XOR gate 209, and to the input of a buffer 210. The output (Q) of the fourth latch 208 is connected to a second input of the second XOR gate 209, and to the input of a buffer 211. The second XOR gate 209 produces the REF signal at its output. The data in the incoming DATA signal is produced, in differential form, at the outputs of the buffers 210 and 211. Although the circuit architecture of the phase detector 200 depicted in FIG. 2 is single-ended, those skilled in the art will appreciate that corresponding circuit architecture could be deployed in differential form.

Figure 3:
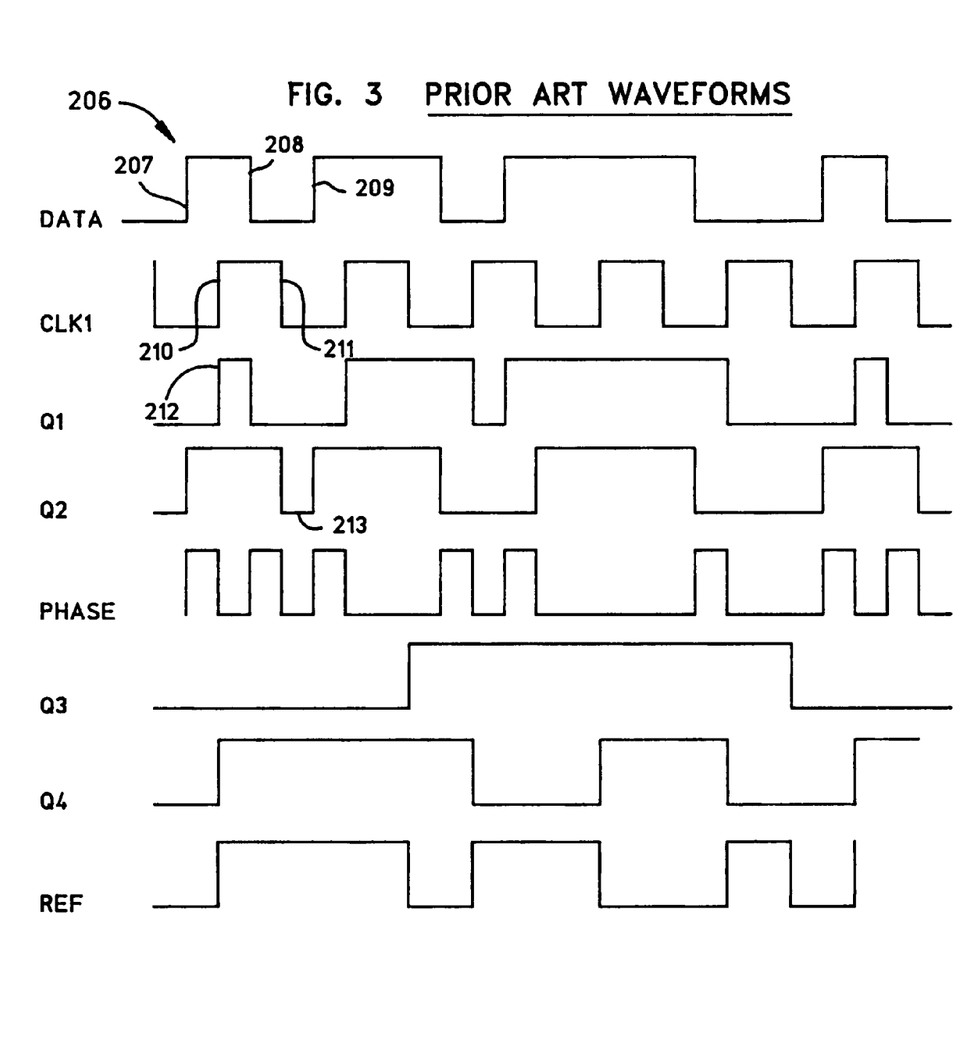
FIG. 3 is a set of waveform diagrams illustrating the operation of the prior art half-rate phase detector of FIG. 2.

The operation of the prior art phase detector 200 is represented by the waveforms of FIG. 3. In FIG. 3, the labels on the several waveforms correspond with identical labels at various locations in the phase detector 200 of FIG. 2 and represent the waveforms of signals at those locations. The CLK1 signal that is provided to the CLK inputs of the first and fourth latches 202 and 208 may be derived, for example, from the CLK of the PLL 100 of FIG. 1. The inverse of the CLK1 signal is provided to the CLK inputs of the second and third latches 204 and 206. When phase lock occurs, one of the transitions of the CLK1 signal is centered in a bit of the DATA signal. The half-rate architecture of the phase detector 200 uses the opposite transitions of the CLK1 signal in the first and second latches to sample the input DATA signal in the latches 202 and 204, causing the production of a signal Q1 at the output of the first latch 202 and a signal Q2 at the output of the second latch 204. The Q1 and Q2 signals are precursors to the REF signal. The PHASE signal is generated by combining Q1 and Q2 signals in the first XOR gate 205. Similarly, the opposite transitions of the CLK1 signal are used to sample the outputs of the first and second latches, with their respective outputs Q3 and Q4 combined by the second XOR gate 209 to produce the REF signal. As shown in FIG. 3, the precursor signals Q1 and Q2 used to generate the REF signal exhibit minimum pulse widths when the DATA signal transitions at its highest possible rate. The minimum width pulse 212 of Q1 is generated by transition 210 of CLK1 signal and transition 208 of DATA signal. The minimum pulse width 213 of Q2 is generated by transition 211 of CLK1 signal and transition 209 of DATA signal. The first XOR gate 205 must respond to these minimum widths in order to faithfully track the difference in phase between the CLK signal and the incoming data signal. However, when these minimum widths begin to approach tens of picoseconds in width, the linear response of the first XOR gate 205 is severely degraded, limiting the linearity of the PHASE outputs in reaching full DC level for different DATA patterns. This contributes to phase offset errors and data pattern dependent phase offsets. This limitation on the performance of the XOR gate leads to an advancing reduction in the accuracy with which the PHASE signal represents the actual phase difference being measured. This limits the linear range of operation and the jitter tolerance of the half-rate phase detector 200.

SUMMARY

A high-speed, half rate phase detector provides an effective solution to the problem of XOR gate response to the minimum width of the PHASE signal precursors (Q1 and Q2) by combining those signals in a multiplexer and combining the multiplexed signal with the incoming delayed DATA signal in an XOR gate. This yields the transition information in the transitions of the precursor signals, which is significant of phase difference, without requiring the XOR gate to respond to the minimum pulse widths of those signals.

DETAILED DESCRIPTION

A novel phase detector is illustrated in one or more of the above-described drawings, and is disclosed in detail in the following description. Although these illustrations and the description may show and describe elements that constitute a preferred embodiment and a best mode of practicing the invention, they are not intended to foreclose other equivalent implementations of the invention.

The invention is a high speed linear half-rate phase detector in which a PHASE signal indicative of a difference in phase between a data signal and a clock signal is generated by combining two precursors of the PHASE signal and subjecting the result to exclusive disjunction with a delayed version of the data signal in an exclusive-OR gate.

Although the half-rate phase detector to be described is illustrated as a circuit or device composed of discrete elements, the expected mode of deployment or utilization would be in combination with other circuits. Thus, the invention is most likely to be found as a component of an integrated circuit (IC), often, although not necessarily, in combination with a frequency detector, manufactured using semiconductor technology, and intended for use in an integrated electronics appliance such as a receiver.

Figure 4:
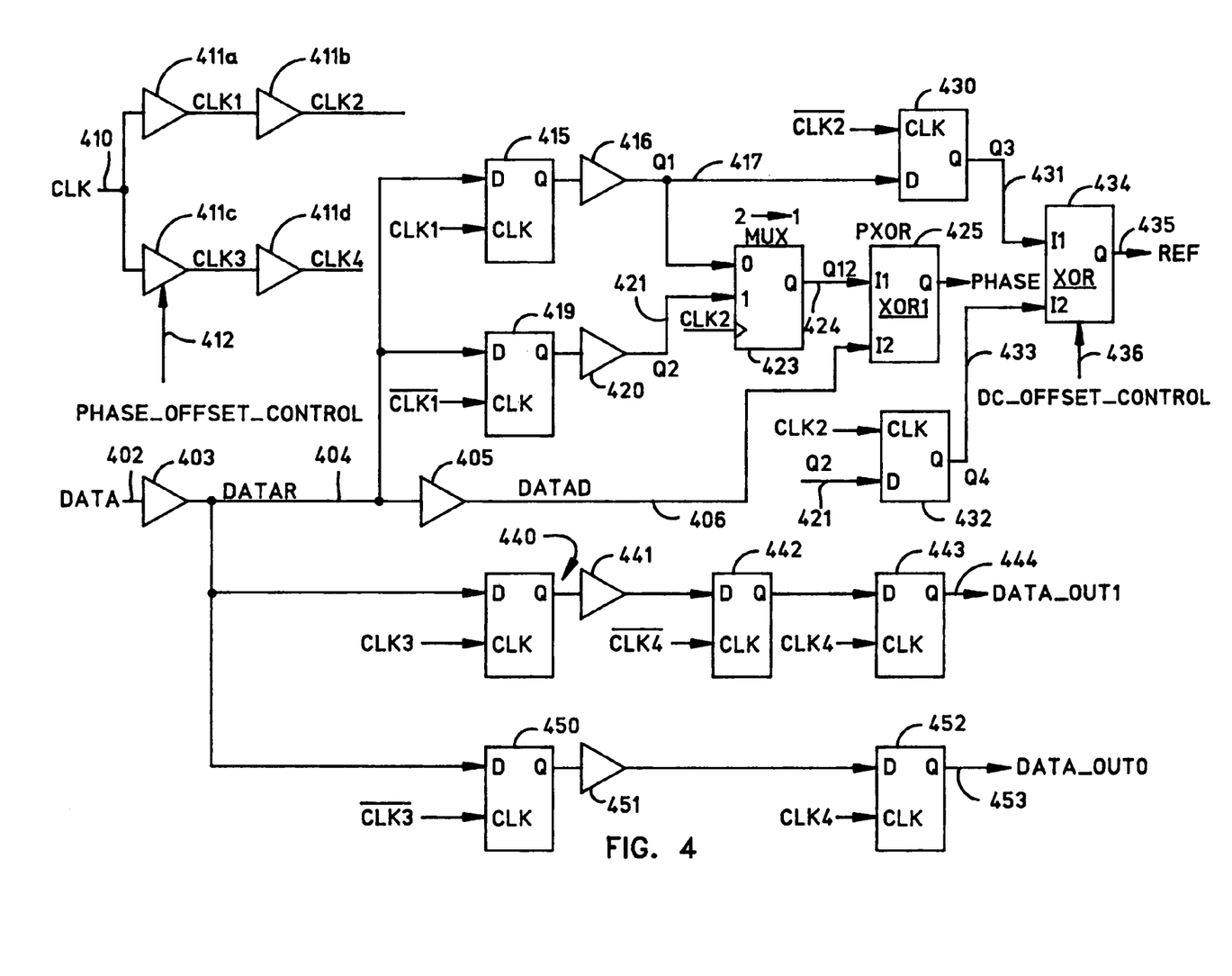
FIG. 4 is a logic diagram of an embodiment of a half-rate phase detector according to the invention.

The invention is illustrated in the logic circuit of FIG. 4, in which a half-rate phase detector according to the invention receives a data signal (DATA) and responds to various versions of a clock signal (CLK) in measuring a phase difference between the data signal and the clock signal. In this example, and in many implementations of the invention, the clock signal is recovered from the data signal, as would occur in the case where the phase detector is a component of a phase-locked loop.

The data signal is received on an input 402. The input 402 feeds the data signal to a buffer 403 which provides a first delayed version of the data signal as DATAR on signal line 404. The output of the buffer 403 is connected via signal line 404 to the input of a buffer 405 which provides a second delayed version of the data signal as DATAD on signal line 406. The clock signal is received on an input 410 which is connected to the inputs of buffers 411a and 411c. The buffer 411a provides a first delayed version of the clock signal as CLK1. The output of the buffer 411a is connected to the input of a buffer 411b which provides a second delayed version of the clock signal as CLK2. The buffer 411c provides a third delayed version of the clock signal as CLK3, and its output is connected to the input of the buffer

411*d*, which provides a fourth delayed version of the clock signal as CLK4. Although not shown explicitly in FIG. 4, it is asserted that the buffers 411*a*, 411*b*, 411*c*, and 41 1*d* also provide the inverse or complementary forms of the respective delayed versions of the clock signal.

Figure 5:
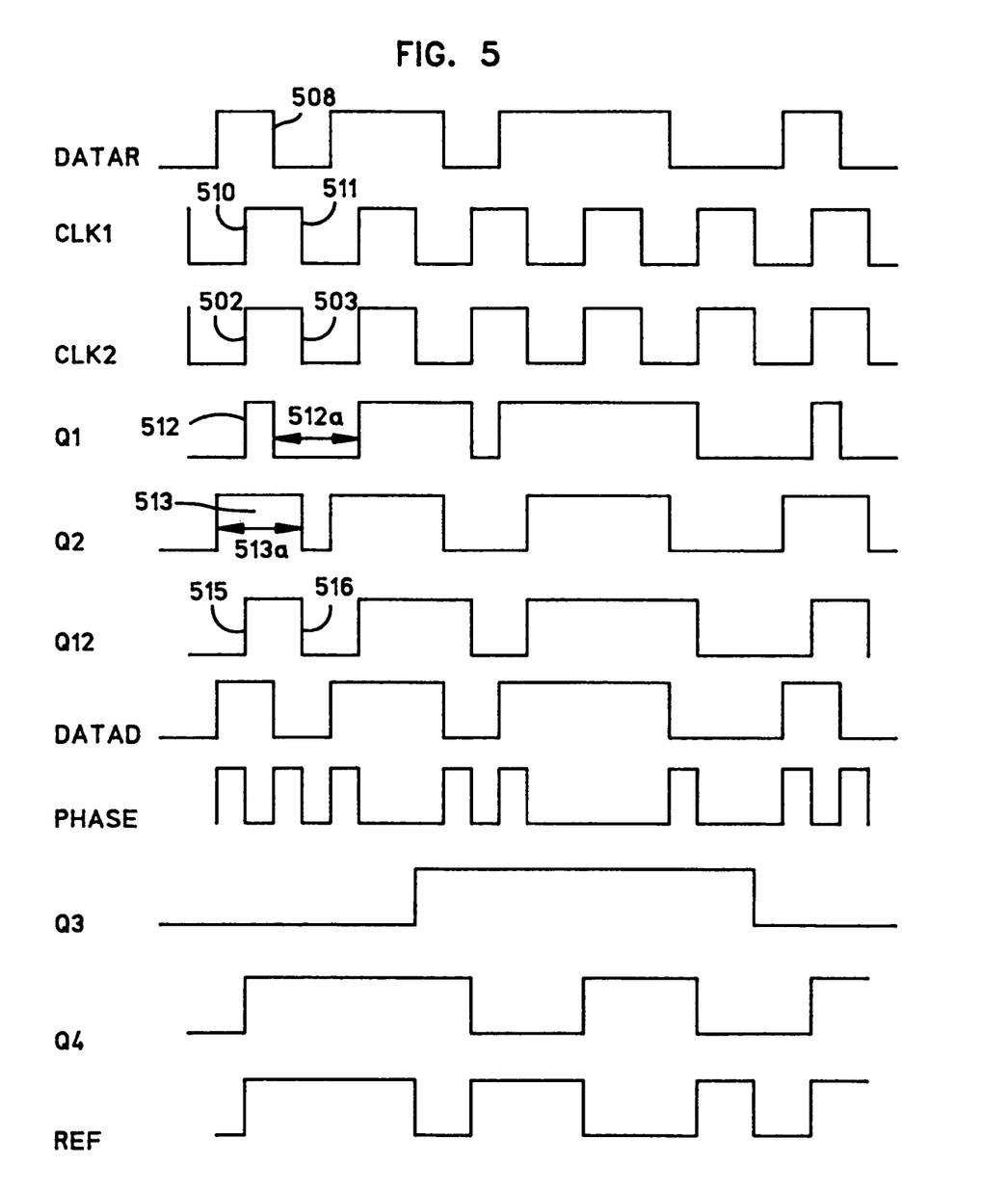
FIG. 5 is a set of waveform diagrams illustrating the operation of the half-rate phase detector of FIG. 4.

The output of the buffer 403 is connected to the data (D) inputs of first and second latches 415 and 419, which together comprise a first latch circuit that combines DATAR with alternate transitions of CLK1 to produce the precursor signals Q1 and Q2. The output of the latch 415 is connected through a buffer 416 to a signal line 417. The latch 415 has a clock input (CLK) which receives CLK1. The output of the latch 419 is connected through a buffer 420 to a signal line 421. The latch 419 has a clock input (CLK) which receives the inverse of CLK1. A multiplexer 423 has a first input (0) connected to the signal line 417, a second input (1) connected to the signal line 421, and an output (Q). The multiplexer 423 has a control input for receiving CLK2. As seen in FIG. 5, when CLK2 transitions positively, at 502, for example, the multiplexer 423 connects its input (1) to its output (Q); when CLK2 transitions negatively, as at 503, the multiplexer 423 connects its input (0) to its output (Q). A first exclusive-OR (XOR) gate 425 has a first input (I1), a second input (I2) and an output (Q). The first input of the XOR gate 425 is connected via signal line 424 to the output of the multiplexer 423; the second input of the XOR gate 425 is connected to the signal line 421, and thereby to the output of the buffer 420.

Refer now to FIGS. 4 and 5 for an understanding of how the half-rate phase detector of the invention generates, or produces a PHASE signal indicative of a linear phase difference between the data and clock signals. The latches 415 and 419 sample DATAR at their respective inputs in response to successive opposite transitions of CLK1. These latches produce the PHASE precursor signals Q1 and Q2 through the buffers 416 and 420, respectively. These may be denoted as first precursor signals. The multiplexer 423, controlled by CLK2, multiplexes the first precursor signals, producing a multiplexed signal Q12. The multiplexed signal Q12 is combined with DATAD by an exclusive disjunction (exclusive-OR operation) performed by the XOR gate 425, which yields the PHASE signal. As can be appreciated with reference to FIG. 5, the control of the multiplexer 423 by CLK2 produces a signal Q12. The rising edge of Q12 is generated by the rising edge of CLK2 that samples the region 513*a* in FIG. 5. The falling edge of Q12 is generated by the falling edge of CLK2 that samples the region 512*a* in FIG. 5. As seen in FIG. 5, the sampled regions 512*a* and 513*a* are of wider pulse width than the minimum possible pulse widths of the precursor signals. Thus, although the minimum pulse widths 512 and 513 of the precursor signals Q1 and Q2 are produced in the phase detector of FIG. 4, the critical transitions of those signals are produced in the transitions 515 and 516 of the multiplexed signal Q12 on a pulse of greater width. This provides the transition information to the first XOR gate 425 without the burden imposed by the minimum pulse widths of Q1 and Q2.

The half-rate phase detector of FIG. 4 generates the REF signal by means of third and fourth latches 430 and 432, which together comprise a second latch circuit that combines the first precursor signals Q1 and Q2 with alternate transitions of CLK2 to produce second precursor signals Q3 and Q4 from which the reference signal REF is derived. The latch 430 has a data input (D) connected to the output of the latch 415 via signal line 417 and inverter 416, a clock input for receiving the inverse form of CLK2, and an output (Q) connected via signal line 431 to the first input (I1) of a second XOR gate 434. The latch 432 has a data input (D) connected to the output of the latch 419 via signal line 421 and inverter 420, a clock input for receiving the positive form of CLK2, and an output (Q) connected via signal line 433 to the second input (I2) of the second XOR gate 434. The XOR gate 434 has an output (Q) connected to a signal line 435. As may be understood with reference to FIGS. 4 and 5, the latch 430 samples Q1 in response to the inverse form of CLK2 to produce Q3, and the latch 432 samples Q2 in response to the positive form of CLK2 to produce Q4. The precursor signal Q3 is combined with the precursor signal Q4 by an exclusive disjunction (exclusive-OR operation) performed by the XOR gate 434, which yields the reference signal.

Data is decoded from the data signal by a third latch circuit including fifth, sixth, and seventh latches 440, 442, and 443, which provide a decoded data signal DATA_OUT1 having a first (preferably, odd) bit polarity, and eighth and ninth latches 450 and 452, which provide a decoded data signal DATA_OUT0 having a second (preferably, even) bit polarity. In this regard, the latch 440 has a data input (D) on which it receives DATAR on signal line 404, a clock input for receiving CLK3, and an output (Q) connected to the input of a buffer 441. The latch 442 has an input (D) connected via the buffer 441 to the output of the latch 440, a clock input for receiving the inverse form of CLK4, and an output. The latch 443 has an input (D) connected to the output of the latch 442, a clock input for receiving the positive form of CLK4, and an output (Q) connected to the signal line 444. The latch 450 has a data input (D) on which it receives DATAR on signal line 404, a clock input for receiving the inverse form of CLK3, and an output (Q) connected to the input of a buffer 451. The latch 452 has an input (D) connected via the buffer 451 to the output of the latch 450, a clock input for receiving the positive form of CLK4, and an output (Q) connected to the signal line 453.

Additional desirable features include two offset features incorporated into the buffer 411*c* that produces CLK3, and the second XOR gate 434 that produces REF. Either feature, or both features, may be operated by a user to fine tune the operation of the half-rate phase detector. The PHASE_OFFSET_CONTROL input to the buffer 411*c* on signal line 412 enables a user to independently offset the phase of the clock signal CLK3 from the center of a data pulse DATAR in order to optimize jitter tolerance of the data decoding operation of the third latch circuit without affecting the control operation of a phase locked-loop incorporating the phase detector. The DC_OFFSET_CONTROL input to the XOR gate 434 on signal line 436 enables a user to change or adjust the DC voltage reference with which the second XOR gate 434 operates. This symmetrically adjusts the current source ratios of the XOR gate 434 without affecting the linear phase transfer curve, enabling control of DC offset of the XOR gate 434 to near zero. This enhances the ability of the half-rate phase detector to tolerate large numbers of successive identical patterns in the data signal as smaller offsets are integrated by a PLL filter. Both of the PHASE_OFFSET_CONTROL and DC_OFFSET_CONTROL signals are preferably provided as dc voltages and user programmable control signals.

I claim:

1. A method for phase detection by an exclusive-OR gate in a half-rate phase detector using a clock signal synthesized from an incoming data signal, comprising:
producing delayed versions of the clock signal;
producing delayed versions of the incoming data signal;

combining a first delayed version of the incoming data signal with alternate transitions of a first delayed version of the clock signal to produce first precursor signals;

multiplexing the first precursor signals in response to a second delayed version of the clock signal to produce a multiplexed signal;

providing the multiplexed signal only to an input of the exclusive-OR gate;

combining the multiplexed signal with a second delayed version of the incoming data signal in the exclusive-OR gate to produce a phase signal indicative of a phase difference between the incoming data signal and the clock signal;

combining the first precursor signals with alternate transitions of the second delayed version of the clock signal to produce second precursor signals; and combining the second precursor signals to produce a reference signal indicative of a degree of synchronization between an interval in the incoming data signal and a corresponding integration interval.

2. The method of claim 1 wherein combining the second precursor signals includes the exclusive disjunction of the second precursor signals.

3. The method of claim 2, further including adjusting a DC voltage level of the reference signal.

4. A half-rate phase detector for indicating a phase difference between an incoming data signal and a clock signal synthesized from the incoming data signal, comprising:

a first latch circuit for combining a first delayed version of the incoming data signal with alternate transitions of a first delayed version of the clock signal to produce first precursor signals;

a multiplexer connected to the first latch circuit for multiplexing the first precursor signals in response to a second delayed version of the clock signal to produce a multiplexed signal, the multiplexer including an output for providing the multiplexed signal to a single input;

a first exclusive-OR gate with a first input connected to the multiplexer output and a second input for receiving a second delayed version of the incoming data signal for combining the multiplexed signal with the second delayed version of the incoming data signal to produce a phase signal indicative of a phase difference between the incoming data signal and the clock signal;

a second latch circuit connected to the first latch circuit for combining the first precursor signals with alternate transitions of the second delayed version of the clock signal to produce second precursor signals; and a second exclusive-OR gate connected to the second latch circuit for combining the second precursor signals to produce a reference signal indicative of a degree of synchronization between an interval in the incoming data signal and a corresponding integration interval.

5. The half-rate phase detector of claim 4, further including means connected the second exclusive-OR gate for adjusting a DC voltage level of the reference signal.

6. A half-rate phase detector for detecting a phase difference between a data signal and a clock signal, comprising:

an input for receiving the data signal;

a first latch for sampling a first delayed version of the data signal in response to a first delayed version of the clock signal, the first latch having an output;

a second latch for sampling the first delayed version of the data signal in response to the inverse of the first delayed version of the clock signal, the second latch having an output;

a multiplexer having a first input connected to the output of the first latch, a second input connected to the output of the second latch, a control input for receiving a second delayed version of the clock signal, and an output;

a first exclusive-OR gate having a first input connected to the output of the multiplexer, a second input for receiving a second delayed version of the data signal, and an output for producing a phase signal representing a phase difference between the data signal and the clock signal;

the multiplexer output being connected only to the first input of the first exclusive-OR gate a third latch having a data input connected to the output of the first latch, a clock input for receiving the inverse of a second delayed version of the clock signal, and an output;

a fourth latch having a data input connected to the output of the second latch, a clock input for receiving the second delayed version of the clock signal, and an output; and a second exclusive-OR gate having a first input connected to the output of the third latch, a second input connected to the output of the fourth latch, and an output for producing a reference signal indicative of a degree of synchronization between an interval in the data signal and a corresponding integration interval.

7. The half-rate phase detector of claim 6, further comprising a DC offset input in the second exclusive-OR gate.

8. The half-rate phase detector of claim 7, further comprising:

a latch circuit having an input for receiving the first delayed version of the data signal for decoding data from the data signal in response to a third delayed version of the clock signal and a fourth delayed version of the clock signal.

9. The half-rate phase detector of claim 8, wherein the latch circuit comprises:

a fifth latch with an input for receiving the first delayed version of the data signal, a clock input for receiving the third delayed version of the clock signal, and an output;

a sixth latch with an input connected to the output of the fifth latch, a clock input for receiving the inverse of the fourth delayed version of the clock signal, and an output;

a seventh latch with an input connected to the output of the sixth latch, a clock input for receiving the fourth delayed version of the clock signal, and an output for providing a decoded data signal in a first polarity;

an eighth latch with an input for receiving the first delayed version of the data signal, a clock input for receiving the inverse of the third delayed version of the clock signal, and an output; and a ninth latch with an input connected to the output of the eighth latch, a clock input for receiving the fourth delayed version of the clock signal, and an output for providing a decoded data signal in a second polarity.

10. A method executable by a half-rate phase detector for detecting a phase difference between a data signal and a clock signal, the method comprising:
  receiving the data signal;
  sampling a first delayed version of the data signal in a first latch in response to a first delayed version of the clock signal, the first latch having an output;
  sampling the first delayed version of the data signal in a second latch in response to the inverse of the first delayed version of the clock signal, the second latch having an output;
  producing a multiplexed signal by multiplexing the outputs of the first latch and the second latch in response to a second delayed version of the clock signal;
  providing the multiplexed signal to only a single input;
  combining the multiplexed signal provided to only a single input with a second delayed version of the data signal in a first exclusive-OR gate to produce a phase signal representing a phase difference between the data signal and the clock signal;
  sampling the output of the first latch in a third latch having a data input connected to the output of the first latch, a clock input for receiving the inverse of a second delayed version of the clock signal, and an output;
  sampling the output of the second latch in a fourth latch having a data input connected to the output of the second latch, a clock input for receiving the second delayed version of the clock signal, and an output; and
  combining the output of the third latch with the output of the fourth latch in a second exclusive-OR gate to produce a reference signal indicative of a degree of synchronization between an interval in the data signal and a corresponding integration interval.

11. The method of claim 10, further comprising adjusting the DC voltage level of the reference signal by applying a DC offset input in the second exclusive-OR gate.

12. The method of claim 11, further comprising:
  decoding data from the data signal in a latch circuit in response to a third delayed version of the clock signal and a fourth delayed version of the clock signal.

13. The method of claim 12, wherein decoding data comprises:
  sampling the first delayed version of the data signal in a fifth latch in response to third delayed version of the clock signal;
  sampling an output of the fifth latch in a sixth latch in response to the inverse of the fourth delayed version of the clock signal;
  sampling an output of the sixth latch in a seventh latch in response to the fourth delayed version of the clock signal to provide a decoded data signal in a first polarity;
  sampling the first delayed version of the data signal in an eighth latch in response to the inverse of the third delayed version of the clock signal; and
  sampling an output of the eighth latch in a ninth latch in response to the fourth delayed version of the clock signal to provide a decoded data signal in a second polarity.

* * * * *